(12) United States Patent
Main et al.

(10) Patent No.: US 6,369,647 B1
(45) Date of Patent: Apr. 9, 2002

(54) DEMODULATOR CIRCUIT AND METHOD OF TUNING

(75) Inventors: William Eric Main, Mesa; Danielle L. Coffing, Tempe; Klaas Wortel, Phoenix, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/746,286

(22) Filed: Dec. 21, 2000

(51) Int. Cl.[7] .......................... H03D 3/02; H03D 3/22; H03B 5/24; H03K 7/00; H03L 7/800

(52) U.S. Cl. .................. 329/301; 329/302; 329/324; 331/34; 331/153; 331/172

(58) Field of Search ................... 329/300–303, 329/315, 323, 324; 331/34, 143, 153, 172; 360/30; 375/324, 334; 455/214, 337

(56) References Cited

U.S. PATENT DOCUMENTS

| | | | |
|---|---|---|---|
| 4,007,426 A | * | 2/1977 | Utsanomiya ................ 329/103 |
| 4,918,406 A | * | 4/1990 | Bawmbach et al. .... 331/117 R |
| 4,928,068 A | | 5/1990 | Main .......................... 329/324 |
| 5,731,745 A | * | 3/1998 | Parham ...................... 332/123 |
| 6,133,802 A | * | 10/2000 | Ma ............................. 331/172 |
| 6,188,291 B1 | * | 2/2001 | Gopinathan et al. .......... 331/45 |

FOREIGN PATENT DOCUMENTS

GB    2029174 A   *   3/1980

* cited by examiner

*Primary Examiner*—David Mis
(74) *Attorney, Agent, or Firm*—Mark J. Fink

(57) ABSTRACT

A demodulator circuit (10) includes an oscillator (12) and an injection circuit (14). An Automatic Frequency Control (AFC) signal adjusts the tail current of a current source (28) provided in the oscillator (12) and the tail current of a current source (44) provided in the injection circuit (14). A phase detector (16) compares the phase of the signal generated by the oscillator (12) with the phase of the injected input signal. The phase detector (16) generates an output signal $V_o$ having a value of zero when the input signal is in quadrature with the signal generated by the oscillator (12), but generates a non-zero signal that is used to adjust the AFC signal when the input signal and the signal generated by the oscillator (12) are not in quadrature.

17 Claims, 1 Drawing Sheet

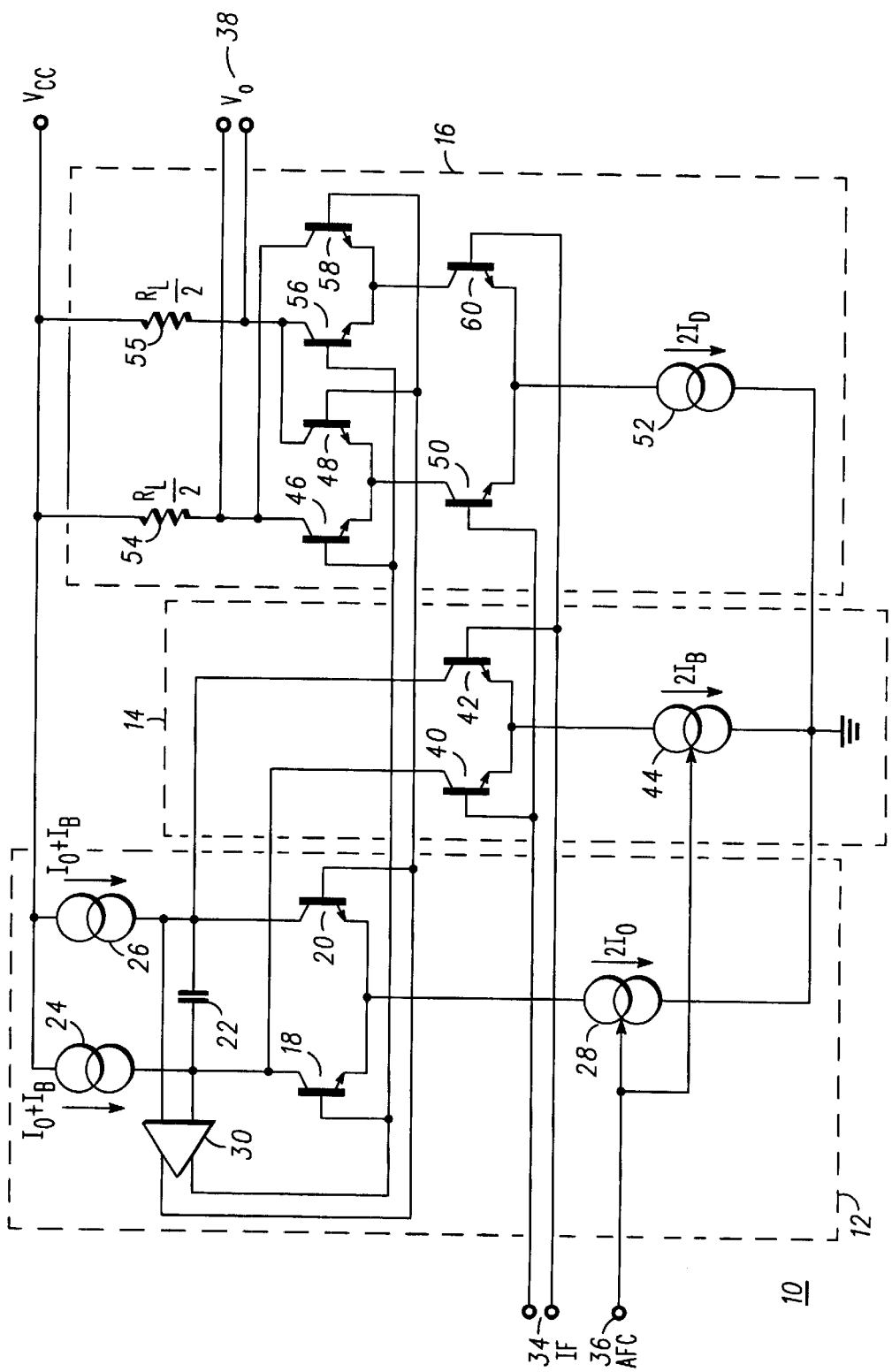

DEMODULATOR CIRCUIT AND METHOD OF TUNING

This invention is related, in general, to demodulation circuits and, more specifically, to Frequency Modulation (FM) and Frequency-Shift Keying (FSK) demodulation circuits.

Many portable communication products utilize circuits that can perform well in a low power environment. The communication products have a front-end receiver designed for cellular or personal communications service (PCS) that converts a Radio Frequency to Intermediate Frequency (RF-to-IF). The information encoded in the signal received in a two-way communication link by the receiver in these handheld devices is recovered using demodulator circuits. The receiver typically integrates Low Noise Amplifiers (LNAs), quadrature phase shift networks and mixers for down converting the received signal from RF to IF and a demodulator for producing the recovered output signal. The recovered signal is proportional to the deviation of the frequency of the received signal relative to the center frequency of an oscillator found in the demodulator circuit. The receiver may operate in the 800–900 MHz cellular band and the 1800–1900 MHz PCS band, as well as other frequency bands.

A problem associated with most prior art FM demodulator circuits is the variation in output amplitude and bandwidth with process and temperature. One type of demodulator, i.e., the quadrature demodulator, generates an output signal having an amplitude that varies with the gain and bandwidth that varies with a phase shift network and with the input signal level. Another type of demodulator, i.e., the phase-locked loop demodulator, generates an output signal having an amplitude that varies with the input signal level, as well as capacitor values and resistor values that determine the gain of the VCO. Prior art injection-locked demodulators also generate an output signal that varies in amplitude depending upon capacitor and resistor values. The bandwidth of these types of prior art demodulators is not constant, but varies either with component values or the loop filter, or both.

Hence, there exists a need for a demodulation circuit that produces a recovered output signal that is less sensitive to amplitude variations in the received input signal and has a well-defined locking range and bandwidth.

BRIEF DESCRIPTION OF THE DRAWINGS

The sole FIGURE is a circuit diagram of an integrated demodulator circuit.

DETAILED DESCRIPTION OF THE DRAWINGS

The sole FIGURE is a circuit diagram for an integrated demodulator circuit 10 integrated on a semiconductor wafer. Demodulator circuit 10 is used in portable communication products having a front-end receiver that converts a Radio Frequency to Intermediate Frequency (RF-to-IF). Demodulator circuit 10 includes an oscillator 12 having transistors 18 and 20 connected as a differential transistor pair. The collector of transistor 18 is coupled through a current source 24 and the collector of transistor 20 is coupled through a current source 26 to a power conductor that receives the operating voltage $V_{cc}$. Current sources 24 and 26 conduct equal currents and track changes in the currents conducted by current sources 28 and 44 such as to provide a constant average Direct Current (DC) voltage on a capacitor 22. Capacitor 22 is connected between the collectors of transistor 18 and 20. Current sources 24 and 26 both conduct a current that is labeled in the FIGURE as the sum of two current, i.e., current $(I_0+I_B)$. The emitters of transistors 18 and 20 are connected together and further coupled to the ground power conductor through a controlled current source 28. Current source 28 provides the tail current of 2 $I_0$ for oscillator 12. An Automatic Frequency Control (AFC) signal is supplied at input terminal 36 for adjusting the current 2 $I_0$ that is conducted by current source 28.

Demodulator circuit 10 also includes an injection circuit 14 having differential connected transistors 40 and 42. Injection circuit 14 is also referred to as a variable gain amplifier. The collector of transistor 40 is connected to the collector of transistor 18 and the collector of transistor 42 is connected to the collector of transistor 20. The emitters of transistors 40 and 42 are connected together and further coupled through a controlled current source 44 to the ground power conductor. The AFC signal also adjusts the tail current 2 $I_B$ that is conducted by current source 44.

A phase detector 16 in demodulator circuit 10 includes transistors 46 and 48 that form one differential transistor pair and transistors 56 and 58 that form another differential transistor pair. The commonly connected collectors of transistors 46 and 58 are coupled through a resistor 54 to the power conductor receiving the operating voltage $V_{CC}$. The commonly connected collectors of transistors 48 and 56 are coupled through a resistor 55 to the power conductor receiving the operating voltage $V_{CC}$. A signal $V_O$ supplied at terminals 38 is the differential signal generated by the current $I_D$ in resistors 54 and 55. Resistors 54 and 55 each have resistance values of $R_L/2$. The emitters of transistors 46 and 48 are connected together and further connected to the collector of a transistor 50. The emitters of transistors 56 and 58 are connected together and further connected to the collector of a transistor 60. Transistors 50 and 60 form a differential transistor pair having commonly connected emitters that are coupled through a current source 52 that conducts a current of 2 $I_D$ to the ground power conductor. The base terminals of transistors 40 and 50 are connected to each other, the base terminals of transistors 42 and 60 are connected to each other, and further connected to terminals 34 for receiving the signal IF.

Oscillator 12 includes a hysteretic comparator 30 coupled for comparing the differential signals generated across capacitor 22. Comparator 30 has first and second outputs for supplying a differential output signal. One differential signal is supplied to the base terminal of transistor 18 in oscillator 12 and to the base terminals of transistors 46 and 56 in phase detector 16. The other differential signal is supplied to the base terminal of transistor 20 in oscillator 12 and to the base terminals of transistors 48 and 58 in phase detector 16.

In operation, the differential output signals provided to comparator 30 causes the comparator output to change state when the voltage at a first input reaches an upper trip value and the voltage at the second input reaches a lower trip value. The hysteresis in comparator 30 maintains that output state until the voltage at a first input reaches the lower trip value and the voltage at the second input reaches the upper trip value. Upon reaching these new trip values, the output of comparator 30 switches to the opposite state and maintains that opposite state until the input voltages of comparator 30 again cycle to the opposite trip values.

The output state of comparator 30 is fed back to transistors 18 and 20 of oscillator 12 and to transistors 46, 48, 56 and 58 of phase detector 16. Phase detector 16 compares the phase of the output state with the phase of the input signal IF. The signal IF has a modulated input frequency, and normally, the signal IF and the output state have a quadrature relationship with respect to each other, i.e., the phase of the signal IF differs from the phase of the output state by 90°. Phase detector 16 generates an output signal $V_O$ having an average value of zero when the signal IF is in quadrature with the output state. On the other hand, when the input signal IF is not in quadrature with the output state, phase detector 16 generates an output signal $V_O$ having a non-zero value. Another circuit (not shown) receives the non-zero signal $V_O$ and adjusts the AFC signal presented back to demodulator circuit 10 that bring the signal IF and the output state into a quadrature relationship.

The signal $V_O$ provided at terminals 38 is determined as follows:

$$V_O = R_L I_O (I_D/I_B)(\Delta f/f_C)$$

where $R_L$ is the equivalent resistance at output terminals 38, $I_O$ is a current in oscillator 12, $I_D$ is a current in phase detector 16, $I_B$ is a current in injection circuit 14, $\Delta f$ is the frequency deviation from the nominal carrier frequency, and $f_C$ is the nominal carrier frequency.

It should be pointed out that the current $I_B$ tracks the current $I_O$ and the product of $R_L I_D$ is a function of an accurate voltage reference. Therefore, the output amplitude of the signal $V_O$ is a well-defined output amplitude.

The bandwidth of demodulator circuit 10 is given by:

$$B = 2/\pi (I_B/I_0) f_C$$

Again, with the current $I_B$ tracking the current $I_O$ the bandwidth of demodulator circuit 10 is well-defined as a simple function of the nominal carrier frequency $f_C$ and the locking range is given by the product of $(2/\pi)$ B, where B is the bandwidth.

By now it should be appreciated that a demodulator circuit has been described that provides a well-defined locking range, bandwidth, and baseband output amplitude.

What is claimed is:

1. A demodulator circuit for a personal communications service, comprising:
   an oscillator that includes an oscillator differential transistor pair having base terminals coupled for receiving a feedback signal and a tail current controlled by a first signal and a comparator coupled for receiving a differential signal generated by the oscillator differential transistor pair and providing a feedback signal;
   an injector circuit having an injector differential transistor pair having collectors coupled to collectors of the oscillator differential transistor pair, base terminals coupled for receiving a second signal, and a tail current controlled by the first signal; and
   a phase detector having a first input coupled for receiving the feedback signal, a second input coupled for receiving the second signal and generating an output signal for a phase relationship of the feedback signal and the second signal.

2. The demodulator circuit of claim 1, wherein the comparator has first and second trip values that determine a state of the feedback signal and hysteresis for maintaining that state.

3. The demodulator circuit of claim 1, wherein the first signal is an Automatic Frequency Control (AFC) signal.

4. The demodulator circuit of claim 1, wherein the second signal is an Intermediate Frequency (IF) signal.

5. The demodulator circuit of claim 1, wherein the phase detector includes:
   first and second differential transistor pairs having base terminals coupled for receiving the feedback signal; and
   a third differential transistor pair having collectors coupled to common emitters of the first differential transistor pair and common emitters of the second differential transistor pair and base terminals coupled for receiving the second signal.

6. The demodulator circuit of claim 5, wherein the phase detector further includes a current source coupled between common emitters of the third differential transistor pair and a ground power conductor.

7. The demodulator circuit of claim 1, wherein the oscillator further includes first and second current sources coupled between collectors of the oscillator differential transistor pair and an operating power conductor.

8. The demodulator circuit of claim 7, wherein the oscillator further includes a capacitor coupled between the collectors of the oscillator differential transistor pair.

9. A demodulator circuit integrated on a semiconductor wafer receiving an Automatic Frequency Control (AFC) signal and an Intermediate Frequency (IF) signal, comprising:
   a first differential transistor pair having base terminals coupled for receiving a feedback signal, collectors coupled for providing an oscillator signal, and commonly coupled emitter terminals supplying a first tail current controlled by the IF signal;
   a comparator coupled for receiving the oscillator signal and providing the feedback signal;
   a second differential transistor pair having collectors coupled to the collectors of the first differential transistor pair, base terminals coupled for receiving the IF signal, and commonly coupled emitter terminals supplying a second tail current controlled by the IF signal; and
   a phase detector having a first input coupled to an output of the comparator for receiving the feedback signal, a second input coupled for receiving the IF signal and an output for supplying a phase signal based on the feedback signal and the IF signal.

10. The demodulator circuit of claim 9, wherein the phase detector includes:
    third and fourth differential transistor pairs having base terminals coupled for receiving the feedback signal and collector terminals for supplying the phase signal; and
    a fifth differential transistor pair having collectors coupled to common emitters of the third differential transistor pair and common emitters of the fourth differential transistor pair and base terminals coupled for receiving the IF signal.

11. The demodulator circuit of claim 10, further including a current source coupled between common emitters of the fifth differential transistor pair and a ground power conductor.

12. The demodulator circuit of claim 9, further including first and second current sources coupled between collectors of the first differential transistor pair and an operating power conductor.

13. The demodulator circuit of claim 12, further including a capacitor coupled between the collectors of the first differential transistor pair.

14. An injection-locked oscillator, comprising:
    an oscillator having a first input for receiving a frequency control signal; and a variable gain amplifier having an input coupled to the first input of the oscillator, a second input for receiving a modulated input frequency and an output coupled to a second input of the oscillator for locking the oscillator to the modulated input frequency.

15. A demodulator, comprising:

an oscillator having a first input for receiving a frequency control signal;

a variable gain amplifier having a first input coupled to the first input of the oscillator, a second input for receiving a modulated input frequency and an output coupled to a second input of the oscillator; and a phase detector having a first input for receiving the modulated input frequency, a second input coupled for receiving an output signal from the oscillator and an output providing a demodulated output signal.

16. A method of tuning an injection-locked oscillator in a demodulator having frequency control, comprising:

providing a control signal for adjusting a frequency of the injection-locked oscillator; and using the control signal to adjust an amplitude of an injected signal to the injection-locked oscillator.

17. A method of tuning an injection-locked oscillator, comprising:

providing a control signal for adjusting a frequency of the injection-locked oscillator; and using the control signal to adjust an amplitude of an injected signal to the injection-locked oscillator.

* * * * *